United States Patent
Lee et al.

(10) Patent No.: US 9,686,865 B2
(45) Date of Patent: Jun. 20, 2017

(54) NETWORKING PACKAGES BASED ON INTERPOSERS

(71) Applicant: Taiwan Semiconductor Manufacturing Company, Ltd., Hsin-Chu (TW)

(72) Inventors: Yun-Han Lee, Baoshan Township (TW); Mark Shane Peng, Hsin-Chu (TW); Shyh-An Chi, Hsin-Chu (TW)

(73) Assignee: Taiwan Semiconductor Manufacturing Company, Ltd., Hsin-chu (TW)

( * ) Notice: Subject to any disclaimer, the term of this patent is extended or adjusted under 35 U.S.C. 154(b) by 0 days.

(21) Appl. No.: 14/745,673

(22) Filed: Jun. 22, 2015

(65) Prior Publication Data
US 2015/0289376 A1     Oct. 8, 2015

Related U.S. Application Data

(62) Division of application No. 12/964,503, filed on Dec. 9, 2010, now Pat. No. 9,064,715.

(51) Int. Cl.
*H05K 1/11* (2006.01)
*H05K 1/14* (2006.01)
(Continued)

(52) U.S. Cl.
CPC ......... *H05K 1/181* (2013.01); *H01L 25/0655* (2013.01); *H01L 25/18* (2013.01); *H05K 1/111* (2013.01); *H05K 1/115* (2013.01); *H01L 23/147* (2013.01); *H01L 23/538* (2013.01); *H01L 24/16* (2013.01); *H01L 25/0652* (2013.01); *H01L 2223/6677* (2013.01); *H01L 2224/16225* (2013.01); *H01L 2224/16235* (2013.01); *H01L 2225/06565* (2013.01); *H01L 2924/14* (2013.01); *H01L 2924/1433* (2013.01); *H01L 2924/1434* (2013.01); *H01L 2924/1438* (2013.01); *H01L 2924/14335* (2013.01); *H01L 2924/15192* (2013.01);
(Continued)

(58) Field of Classification Search
CPC .. H05K 1/11; H05K 1/14; H01L 25/18; H01L 25/063
USPC ................. 361/782–795, 803; 310/300–305; 710/300–305
See application file for complete search history.

(56) References Cited

U.S. PATENT DOCUMENTS 5,903,908 A    5/1999  Singh et al.
6,996,651 B2   2/2006  Garinger et al.
(Continued)

OTHER PUBLICATIONS

International Technology Roadmap for Semiconductors, "Assembly and Packaging 2007", ITRS Winter Conference 2007, Kamakura, Japan, 28 pp.

*Primary Examiner* — Tuan T Dinh
(74) *Attorney, Agent, or Firm* — Slater Matsil, LLP (57) ABSTRACT

A package structure includes a networking unit including a plurality of switches/routers and a plurality of network interface units coupled to the plurality of switches/routers, and an interposer including a plurality of metal connections. The interposer is substantially free from functional elements built therein. A functional element is outside of, and bonded onto, the interposer, wherein the functional element is electrically coupled to the networking unit through the plurality of metal connections.

18 Claims, 9 Drawing Sheets

(51) Int. Cl.
*H05K 1/18* (2006.01)
*H01L 25/18* (2006.01)
H01L 23/00 (2006.01)
H01L 25/065 (2006.01)
H01L 23/14 (2006.01)
H01L 23/538 (2006.01)

(52) U.S. Cl.
CPC ............ *H01L 2924/15311* (2013.01); *H01L 2924/19041* (2013.01); *H01L 2924/19042* (2013.01); *H01L 2924/19043* (2013.01); *H01L 2924/19105* (2013.01); *H05K 1/141* (2013.01); *H05K 2201/10045* (2013.01); *H05K 2201/10053* (2013.01); *H05K 2201/10378* (2013.01)

(56) References Cited

U.S. PATENT DOCUMENTS

| | | |
|---|---|---|
| 7,397,794 B1 | 7/2008 | Lacroute et al. |
| 2002/0003232 A1 | 1/2002 | Ahn |
| 2007/0225035 A1 | 9/2007 | Gauger, Jr. et al. |
| 2007/0279882 A1 | 12/2007 | Weir |
| 2008/0084893 A1 | 4/2008 | Lee |
| 2009/0210600 A1* | 8/2009 | Jeddeloh ............. G06F 13/1657 710/305 |
| 2009/0322414 A1 | 12/2009 | Oraw |
| 2010/0133704 A1* | 6/2010 | Marimuthu ........... H01L 21/565 257/778 |
| 2010/0259296 A1 | 10/2010 | Or-Bach |
| 2011/0019368 A1 | 1/2011 | Andry et al. |
| 2012/0069537 A1 | 3/2012 | Rofougaran |

* cited by examiner

NETWORKING PACKAGES BASED ON INTERPOSERS

PRIORITY CLAIM AND CROSS-REFERENCE

This application is a divisional of U.S. patent application Ser. No. 12/964,503, entitled "Networking Packages Based on Interposers," filed on Dec. 9, 2010, which application is incorporated herein by reference.

BACKGROUND

In integrated circuit applications, more and more functions are integrated into products. Accordingly, different functional elements such as audio/video elements, 3G video elements, WiFi elements, and blue tooth elements that are integrated in the same product may need to communicate with each other. Messages thus need to be sent between different function elements.

Conventional methods of sending messages include using a shared bus to interconnect all functional elements, and the messages are transmitted through the shared bus. This method, however, suffers from limited bandwidth of the shared bus since at one time, the shared bus cannot transmit two messages simultaneously. Furthermore, the shared bus can only be used to transmit messages encoded for a same protocol.

Network-on-Chip (NOC) scheme was recently used to replace the old shared bus technology. The NOC scheme may be used for messages adopting different bus protocols, and may perform simultaneous data transmission via non-overlapping signal links. The NOC, however, suffers from scalability issues.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel networking package structure is provided in accordance with an embodiment. The variations of the embodiment are discussed. Throughout the various views and illustrative embodiments, like reference numbers are used to designate like elements.

Figure 1:
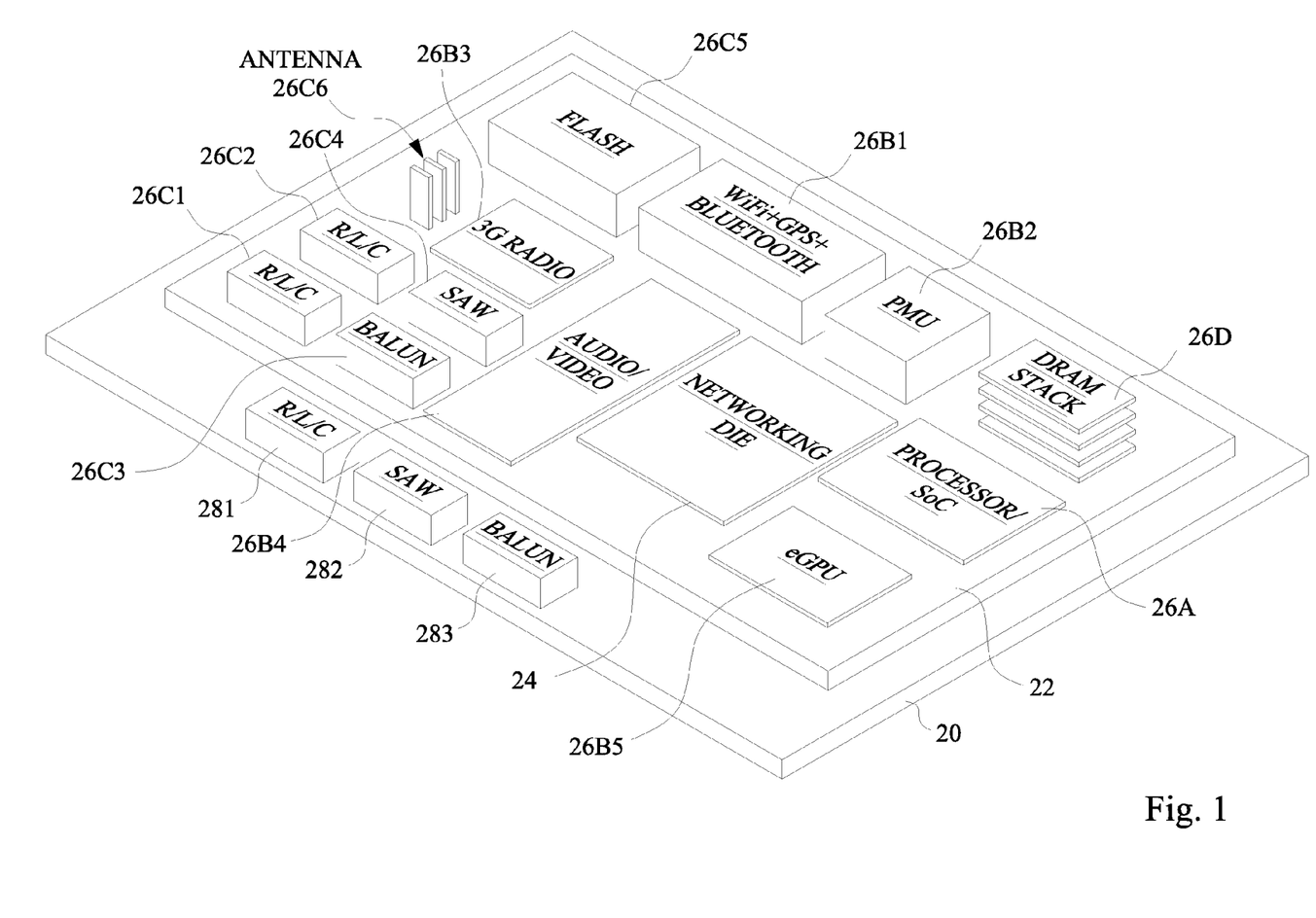
FIG. 1 illustrates a perspective view of a package structure, wherein a networking die and a plurality of functional elements are bonded onto an interposer, which is further bonded to a printed circuit board (PCB)

FIG. 1 illustrates a perspective view of a package structure in accordance with an embodiment. Interposer 22 is mounted or bonded onto printed circuit board (PCB) 20, for example, through solder bonding. Networking die 24 is further bonded onto interposer 22. Functional elements 26A, 26D and the features whose reference notations include the symbols "26B" and "26C" are also bonded or mounted onto interposer 22. The function elements are collectively referred to as 26, and may be discrete dies comprising active devices such as transistors or discrete devices such as discrete capacitors. Alternatively, functional elements 26 may be package chips. Functional elements 26 may include a processor chip(s) 26A, which may also be a system-on-chip (SoC) (referred to as processor/SoC 26A hereinafter). Functional elements 26 may further include application elements 26B, which may be used for specification applications, and are collectively referred to as 26B. Each of application elements 26B may be an embedded graphic processing unit (eGPU) 26B5, a power management unit (PMU) 26B2, a digital signal processing (DSP) unit (not shown), an audio/video unit 26B4, a 3G radio unit 26B3, a WiFi/GPS/blue tooth unit 26B1, and the like, which are collectively referred to as 26B. Packaged solutions (packages) 26C may include eGPU packages 25B5, WiFi/GPS/blue tooth packages 26B1, flash memory packages 26C5, and the like. Furthermore, surface mountable components (which may be discrete devices) such as flash memory units 26C5, antennas 26C6, resistors, capacitors, and inductors (denoted as R/L/C 26C1 and 26C2), Baluns 26C3, surface acoustic wave (SAW) filters 26C4, and the like, may also be mounted on interposer 22. Functional elements 26 may be electrically coupled to each other through metal connections in interposer 22, and/or electrically/signally coupled to networking die 24. Further, each or some of functional elements 26 may be electrically coupled to PCB 20 directly without going through networking die 24 (not shown in FIG. 1, please refer to FIG. 4). Elements 28, which may be resistors, capacitors, and/or inductors (also denoted as R/L/C) 281, Baluns 283, SAW filters 282, and the like (collectively referred to as 28), may also be mounted on PCB 20 directly without going through interposer 22.

Processor/SoC 26A may include processors built therein. In processor/SoC 26A, there may be one, two, four, or even more processors. The buses (not shown) in processor/SoC 26A may have a single layer or multiple layers. Different processors in processor/SoC 26A may run/support the same or different interface protocols/IPs, including, but not limited to, universal asynchronous receiver/transmitter (UART), watch dog timer (WDT), general purpose input/ output (GPIO), inter-integrated circuit (I2C), integrated inter-chip sound (I2S), real time clock (RTC), direct memory access (DMA), SDRAM memory controller (SDMC), static memory controller (SMC), vector interrupt controller (VIC), liquid crystal display (LCD) controller, keyboard/mouse controller, memory card controller, joint photographic experts group (JPEG) codec, bus bridge, bus matrix, and the like. Further, the above listed units such as UART and WDT may be incorporated into processor/SoC 26A in advance to reduce the system development time, and to increase scalability and flexibility.

Figure 2:
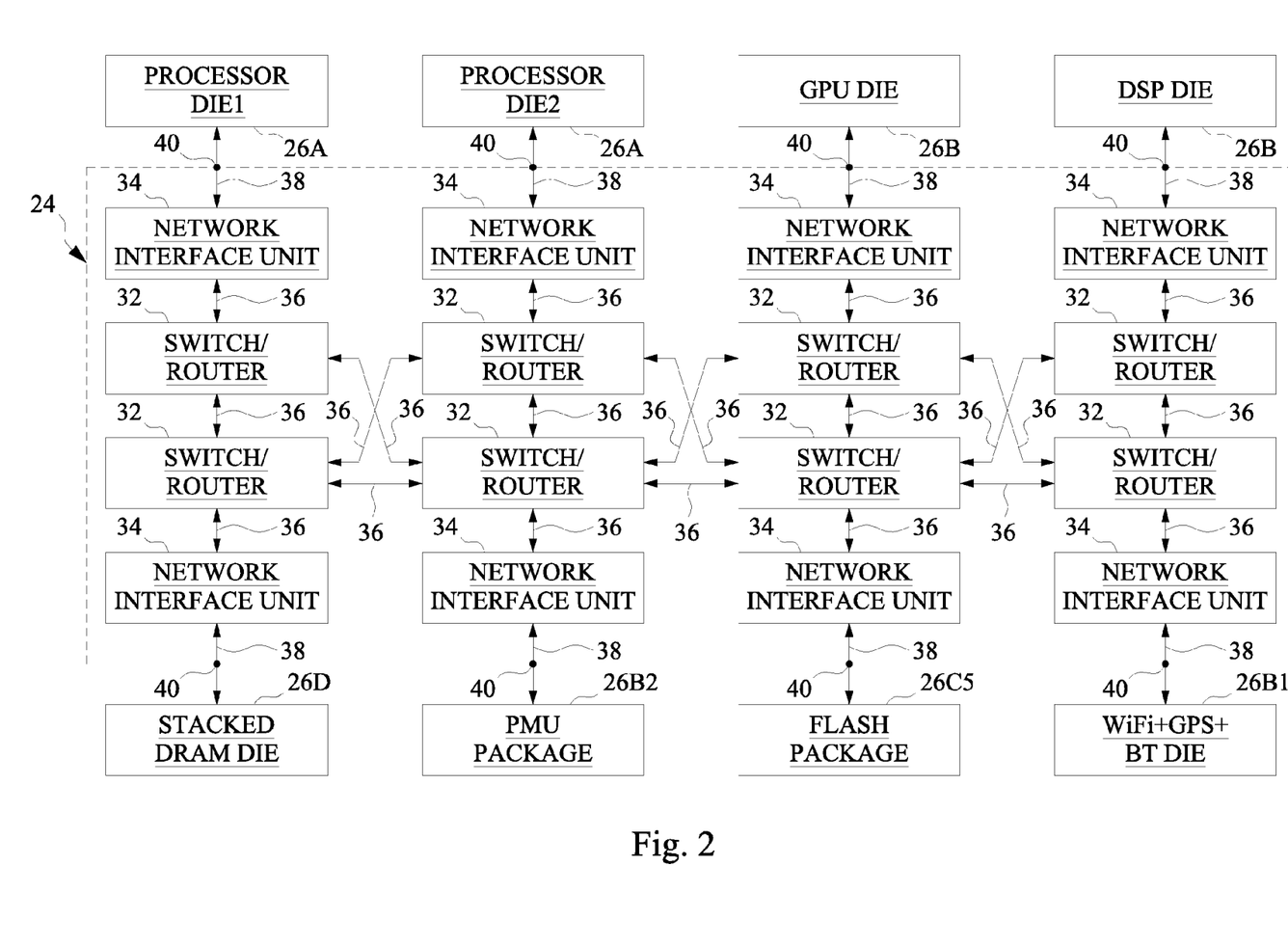
FIGS. 2 and 2A illustrate block diagrams of a portion of the package structure shown in FIG. 1.

FIG. 2 illustrates a block diagram of networking die 24 and functional elements 26. The interactions between networking die 24 and functional elements 26 are also illustrated. Networking die 24 includes a plurality of switches/routers 32, which are configured to receive data packets 36 from each other, and/or from network interface units 34. Switches/routers 32 are also configured to send data packets 36 to each other, and/or to network interface units 34. Network interface units 34 may receive messages 38 from functional elements 26, such as processor/SoC 26A, application units 26B, and/or packaged solutions 26C. Messages 38 may be encoded for different bus protocols such as advanced microcontroller bus architecture (AMBA) (including advanced extensible interface (AXI), advanced high-performance bus (AHB), and/or advanced peripheral bus (APB), known in combination as AXI/AHB/APB), open core protocol (OCP), peripheral component interconnect (PCI), and the like. In an exemplary embodiment, a first functional element such as processor/SoC 26A supports a first protocol, while a second functional element such as eGPU 26B5 supports a second protocol different from the first protocol. Network interface units 34 are configured to convert messages 38 into data packets 36, and send data packages 36 to switches/routers 32. Network interface units 34 are also configured to receive data packets 36 from switches/routers 32, convert data packets 36 to messages 38 that have different protocols, and send messages 38 to functional elements 26. Through network interface units 34 and switches/routers 32, different functional elements 26 may communicate with each other even if they support different protocols.

Networking die 24 further includes a plurality of input/output ports 40, which may be in the form of grouped bond pads (not shown) that are arranged in certain styles. The ports 40 that support the same bus protocol may have the same number of bond pads, and arranged in a same style. Alternatively, ports 40 that support the same bus protocol may also include bond pads that are arranged different from each other. The ports 40 that support different bus protocols may have different number of bond pads, and may be arranged differently. Networking die 24 may have one or a plurality of ports 40 (and the corresponding network interface units 34) supporting each of the different bus protocols.

Figure 3:
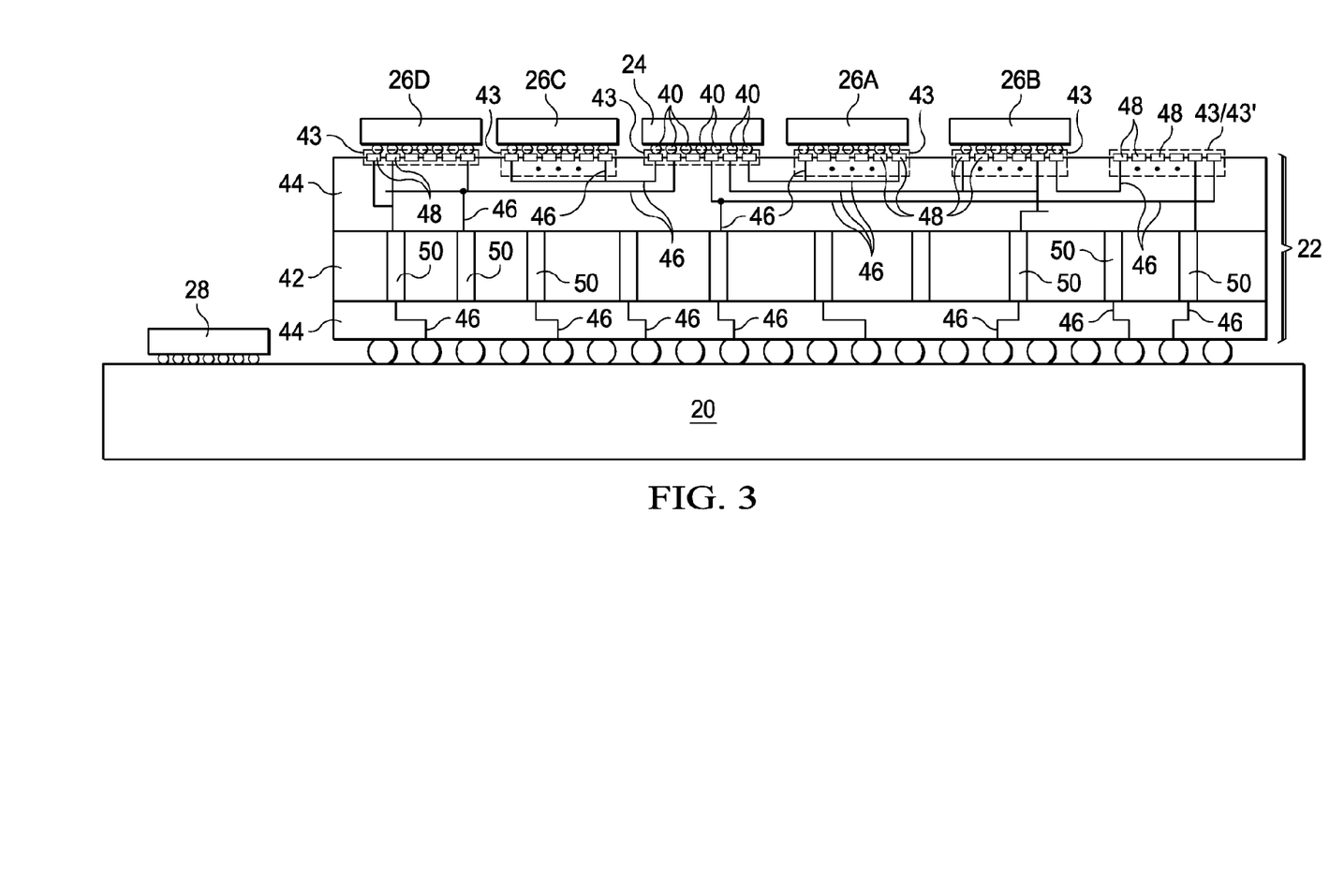
FIG. 3 illustrates an exemplary cross-sectional view of a portion of the package structure as shown in FIG. 1.

FIG. 3 illustrates a cross-sectional view of an exemplary interposer 22. In an embodiment, interposer 22 is a silicon interposer, which includes silicon substrate 42, and a plurality of dielectric layers 44 formed on opposite sides of silicon substrate 42. Substrate 42 may also be formed of materials different from silicon, which may be semiconductor materials, dielectric materials, or the like. Metal connections (including metal lines and vias) 46 are formed in dielectric layers 44. Bond pads 48 are formed on a surface (the surface facing functional elements 26 in FIG. 3) of interposer 22, wherein bond pads 48 are grouped into different groups to form ports 43. Each of ports 43 of interposer 22 is configured to connect to one of functional elements 26. Through substrate vias (TSVs) 50 may be formed in silicon substrate 42 to interconnect metal connections 46 on opposite sides of substrate 42. In an embodiment, interposer 22 is substantially free from passive devices (such as resistors, capacitors, inductors, and the like) formed therein, and may also be free from any active devices such as transistors formed therein. In alternative embodiments, interposer 22 includes passive devices formed therein, but is substantially free from any active devices.

FIG. 3 also illustrates a cross-sectional view of additional components shown in FIG. 2, which components include networking die 24, a plurality of functional elements 26, and PCB 20. Each of the plurality of ports 40 of networking die 24 is symbolized by one of circles. Metal connections 46 in interposer 22 interconnect interposer 22 to functional elements 26A/26B/26C/26D, so that functional elements 26 may exchange messages/signals with each other through networking die 24. It is appreciated that although each of ports 40 is shown as connected to one metal connection 46, it actually may include a plurality of metal bumps connected to a plurality of metal connections. Metal connections 46 may also interconnect functional elements 26, and connect functional elements 26 to PCB 20.

Figure 4:
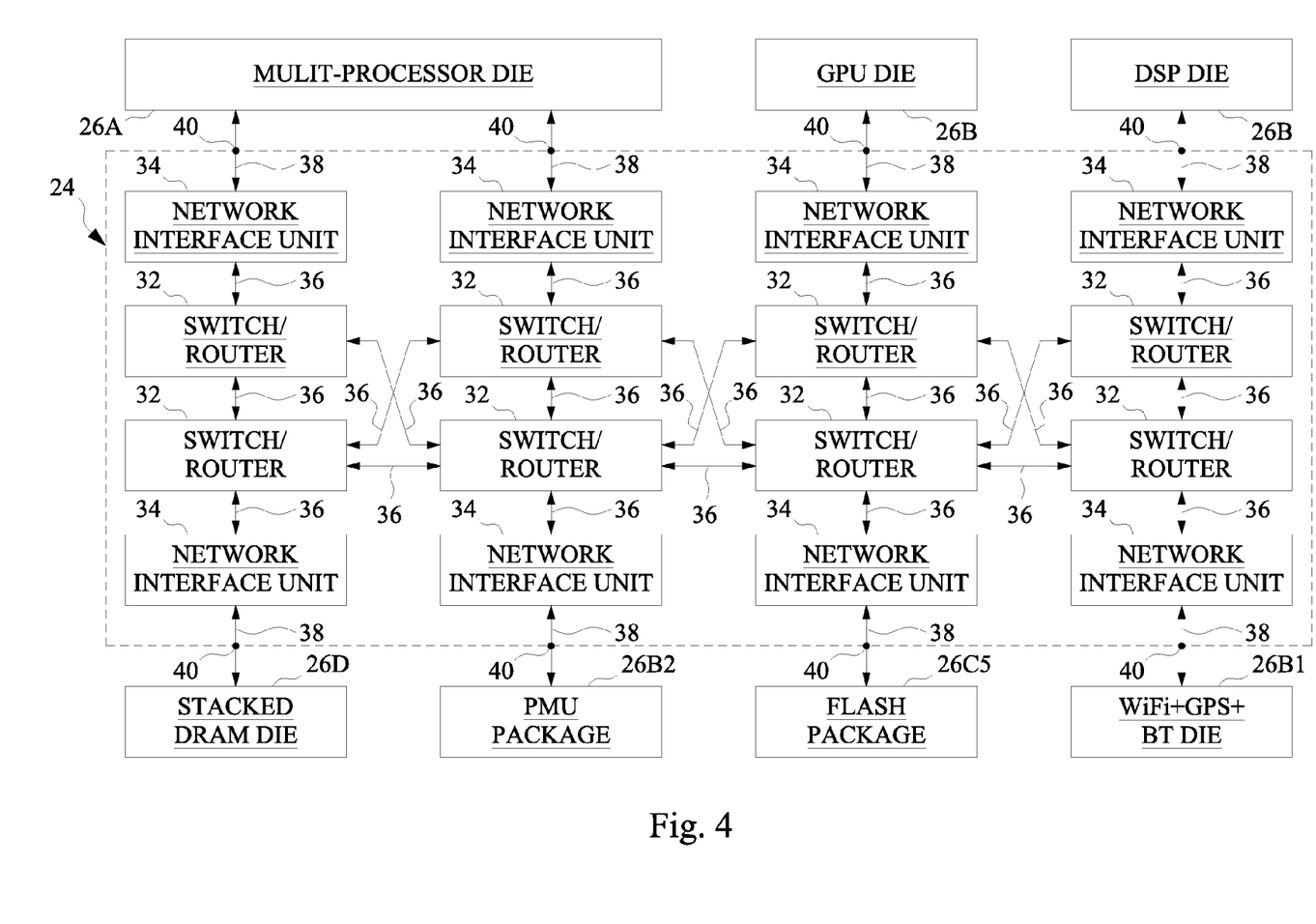
FIG. 4 illustrates a block diagram of a portion of the package structure shown in FIG. 1, wherein a processor/SoC comprises multi-processors.

FIG. 4 illustrates the block diagram of a package structure in accordance with alternative embodiments. This embodiment is similar to the embodiment in FIG. 2, except that processor/SoC 26A may include one or more multi-processors supporting a plurality of bus protocols. Furthermore, processor/SoC 26A may include a plurality of buses (not shown) therein. Accordingly, each of processor/SoC 26A may be connected to more than one network interface unit 34, with each of the connecting network interface units 34 supporting one of the bus protocols.

Figure 5:
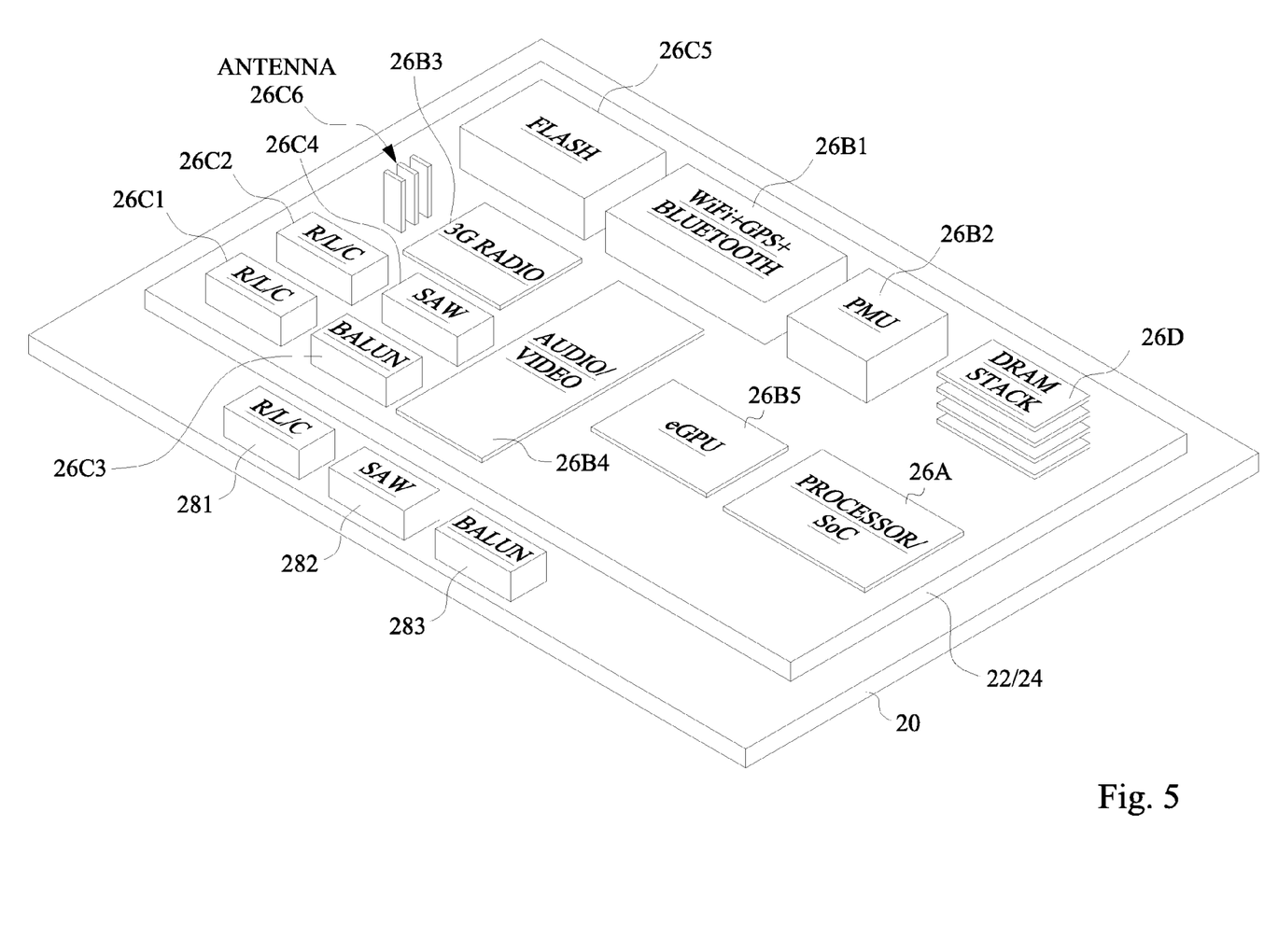
FIG. 5 illustrates a perspective view of a package structure, wherein a networking unit is built in an interposer, and a plurality of functional elements is bonded on the interposer, and wherein the interposer is further bonded to a PCB.

FIG. 5 illustrates a perspective view of a package structure in accordance with alternative embodiments. In this embodiment, the function of networking die 24 is built in interposer 22, and the resulting combined die is referred to as networking interposer die 22/24 hereinafter. The part of networking interposer die 22/24 that has the function of networking die 24 is referred to as networking unit 51 (not shown in FIG. 5, please refer to FIG. 6) throughout the description.

Figure 6:
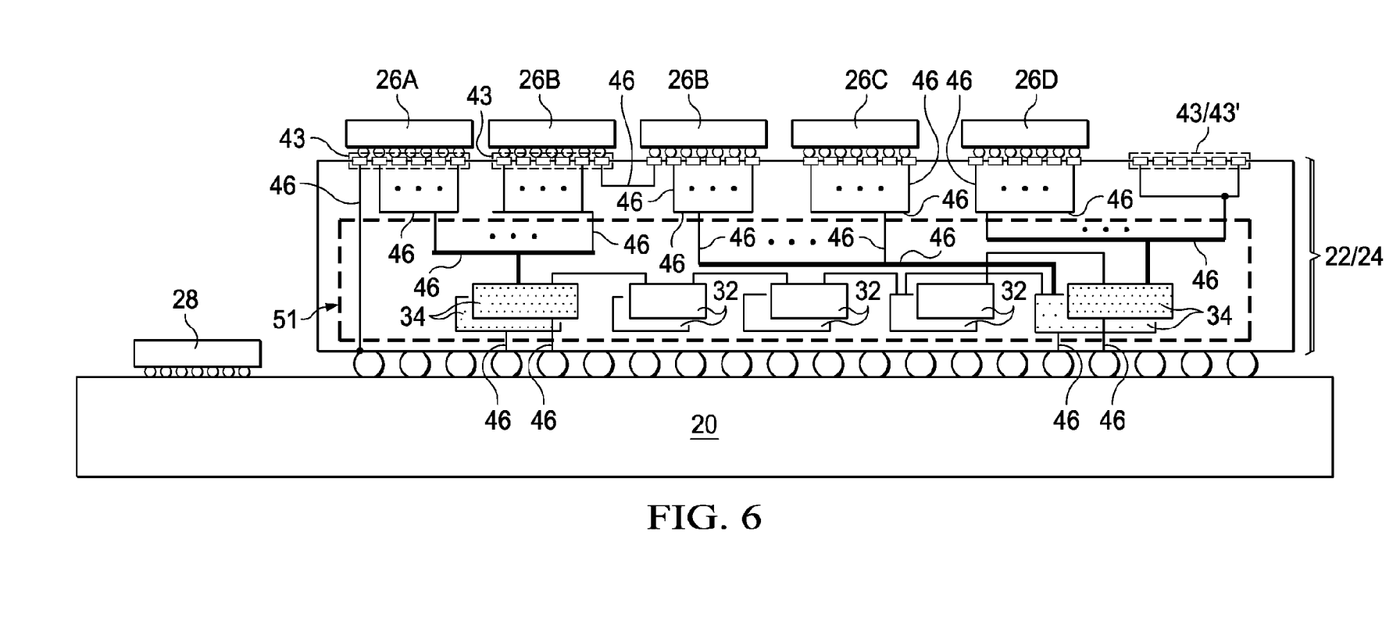
FIG. 6 illustrates a cross-sectional view of the package structure shown in FIG. 5.

FIG. 6 schematically illustrates a cross-sectional view of the package structure shown in FIG. 5, wherein the components inside networking interposer die 22/24 are illustrated using block diagrams. Networking interposer die 22/24 includes a semiconductor substrate (not shown), wherein the devices (transistors, capacitors, resistors, diodes, and the like, not shown) belonging to network interface units 34 and switch/router 32 are formed on the semiconductor substrate. The metal connections 46 (metal lines and vias) and TSVs (not shown in FIG. 6, pleaser refer to FIG. 3) interconnect network interface units 34 and switch/router 32 to function elements 26. Further, metal connections 46 interconnect function elements 26, and connect function elements 26 and network interface units 34 to PCB 20.

In an embodiment, the devices (such as transistors) of network interface units 34 and switch/router 32, and the necessary processors for supporting the operation of network interface units 34 and switch/router 32 are formed inside networking interposer die 22/24. However, functional elements 26 that are not necessary for supporting the operation of network interface units 34 and switch/router 32 are not built inside networking interposer die 22/24. Accordingly, interposer 22 may be substantially free from any active and/or passive devices that are not in networking unit 51.

Figure 7:
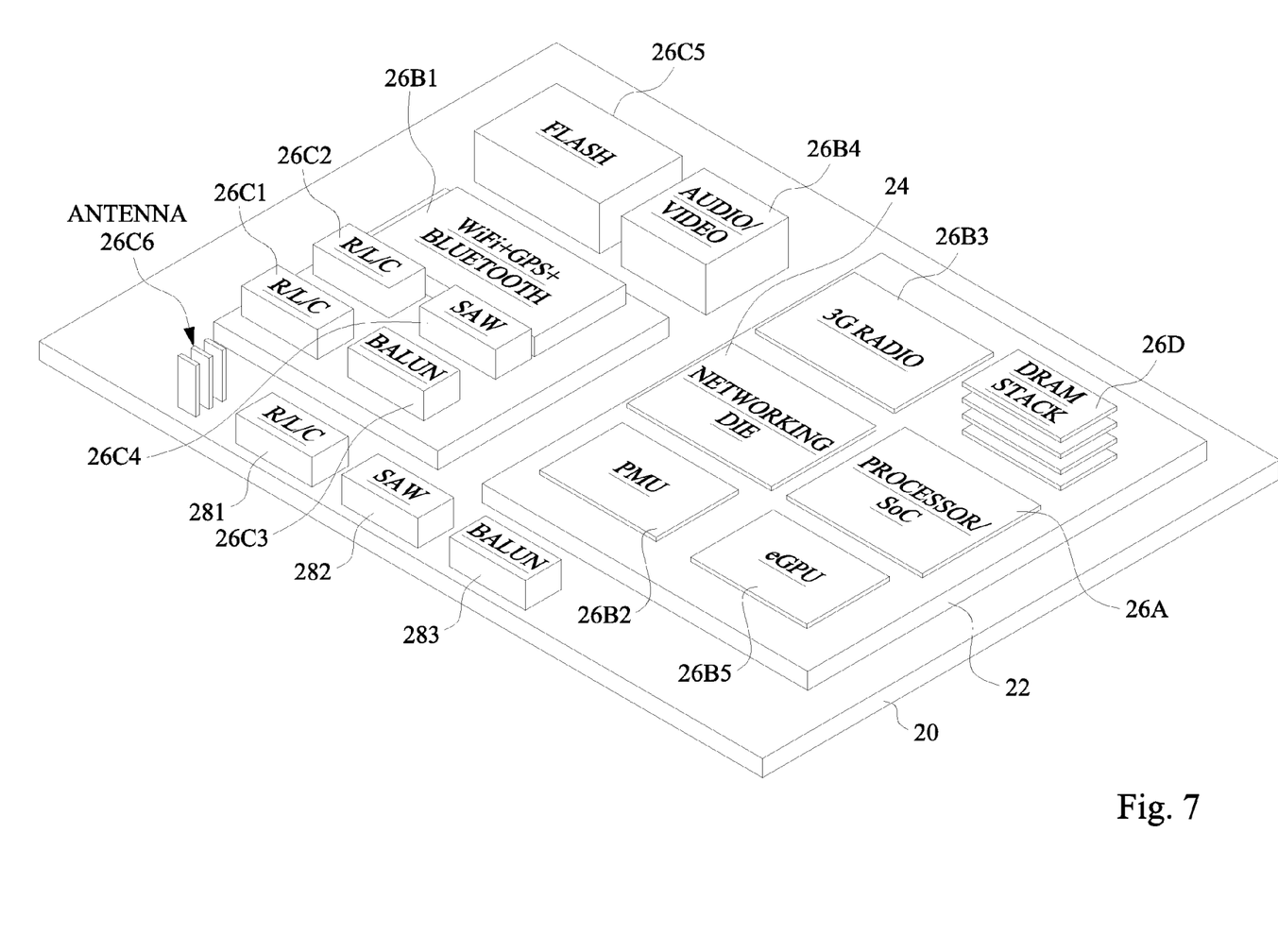
FIG. 7 is a perspective view of a package structure in accordance with alternative embodiments, wherein some functional elements are bonded onto an interposer, and other functional elements are bonded onto a PCB, and wherein a networking die is further bonded onto the interposer.

FIG. 7 illustrates a perspective view of a package structure in accordance with an alternative embodiment. This embodiment is similar to the embodiment shown in FIG. 1, except that some functional elements 26 such as the flash unit and the audio/video unit are mounted on PCB 20 directly, while some other functional elements 26 such as the 3G radio unit and the processor/SoC are bonded on interposer 22. In this embodiment, networking die 24 is bonded onto interposer 22.

Figure 8:
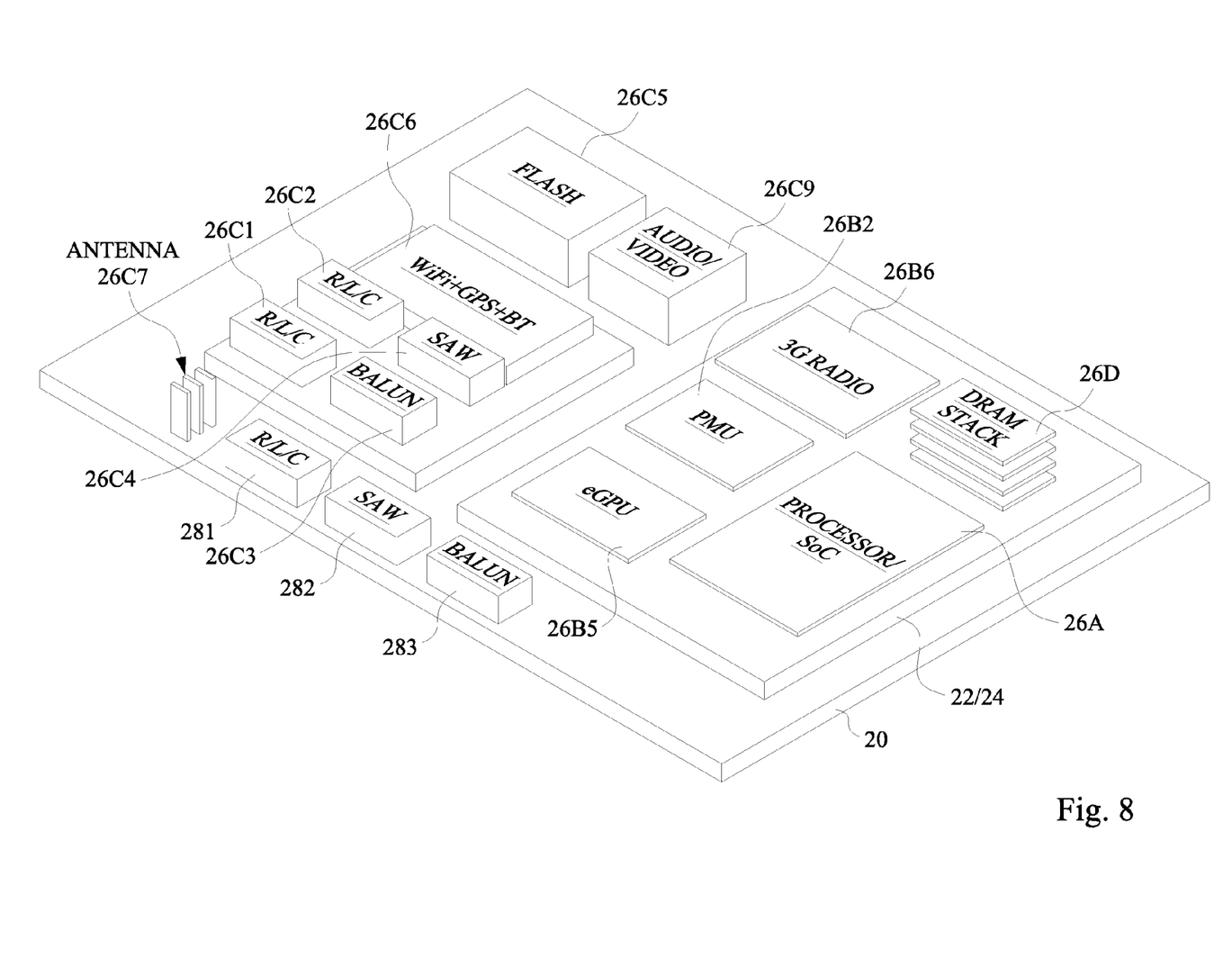
FIG. 8 is a perspective view of a package structure in accordance with alternative embodiments, wherein some functional elements are bonded onto an interposer, and other functional elements are bonded onto a PCB, and wherein a networking unit is built inside the interposer.

FIG. 8 illustrates a perspective view of a package structure in accordance with yet another embodiment. This embodiment is similar to the embodiment shown in FIG. 5, except that some of functional elements 26 are mounted on PCB 20 directly, while some other functional elements 26 are bonded on networking interposer die 22/24. In this embodiment, networking interposer die 22/24 is bonded on PCB 20, with the networking function being built inside networking interposer die 22/24.

Figure 2A:
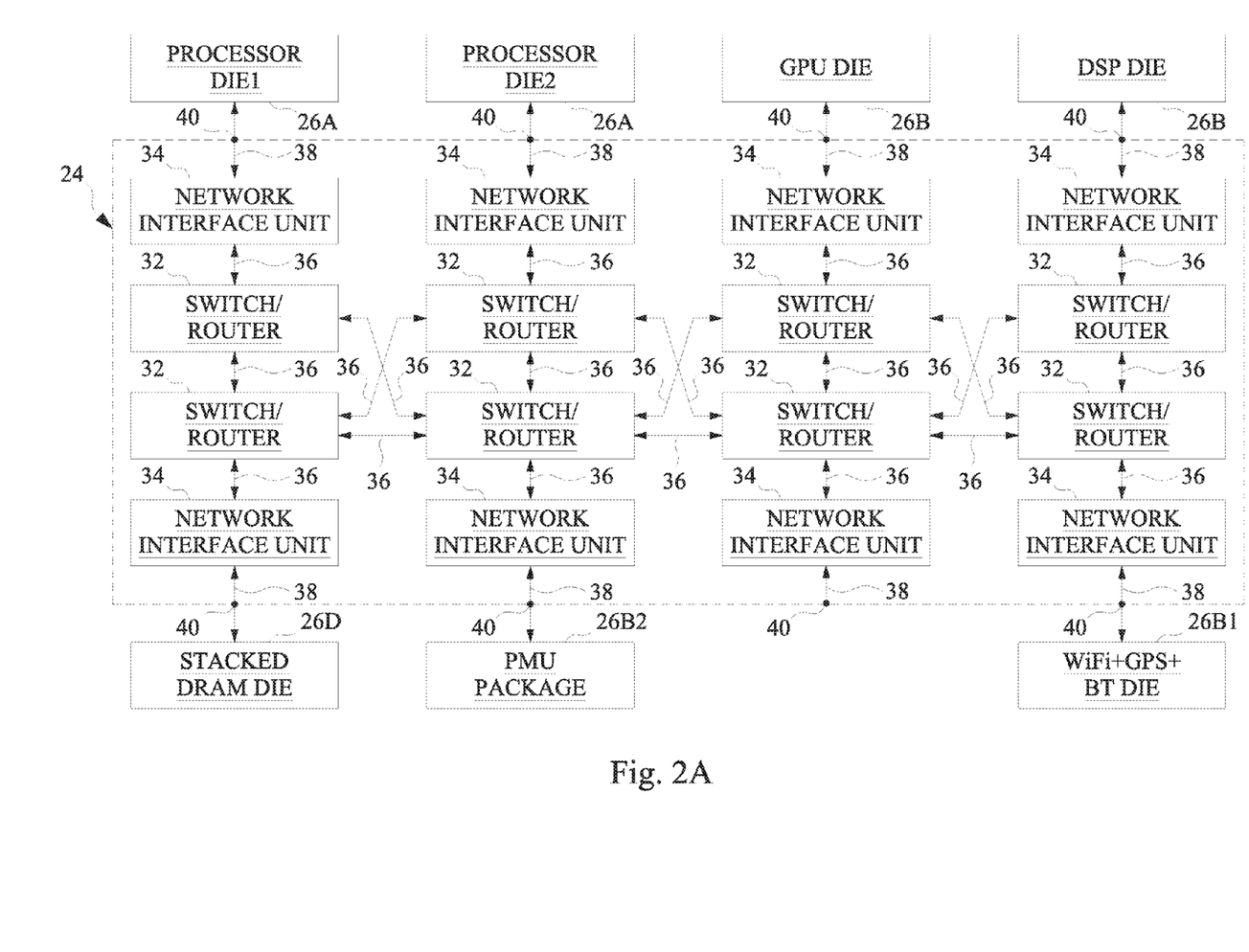

In the embodiments, each of networking die 24 and interposer 22 may include a plurality of ports, and some of the ports may left unused even after the package structure is finished, and after networking die 24 or networking interposer die 22/24 is bonded on PCB 20. For example, referring back to FIG. 2, the illustrated flash package 26C5 may not be connected to networking die 24, and hence the corresponding port 40 in networking die 24 is unused, as illustrated in FIG. 2A. In another example, in FIG. 3, one of ports 43 (also denoted as 43') in interposer 22 is unused, even if metal connections 46 have already been formed to connect port 43' to networking die 24. Similarly, in FIG. 6, one of ports 43 (marked as 43') is unused, even if metal connections 46 have already been formed to connect to networking unit 51 in networking interposer 22/24 to port 43'.

Forming a plurality of ports 40 for networking die 24 (FIG. 2) and a plurality of ports 43 (FIG. 3) for interposer 22 increases the flexibility and the scalability of networking die 24 and interposer 22. For example, networking die 24, interposer 22, and/or networking interposer 22/24 may be formed as standard units. Depending on the intended usage and the function of the package structure, different functional elements may be bonded on interposer 22, so that the function of the resulting package structure can be changed and/or scaled without the need to redesign networking die 24 and/or interposer 22.

In accordance with embodiments, a package structure includes a networking unit including a plurality of switches/routers and a plurality of network interface units coupled to the plurality of switches/routers, and an interposer including a plurality of metal connections. The interposer is substantially free from functional elements built therein. A functional element is outside of, and bonded onto, the interposer, wherein the functional element is electrically coupled to the networking unit through the plurality of metal connections.

In accordance with other embodiments, a package structure includes an interposer including a plurality of metal connections, wherein the interposer is substantially free from active devices therein. A networking die is bonded onto the interposer, wherein the networking die includes a plurality of switches/routers and a plurality of network interface units coupled to the plurality of switches/routers. A plurality of functional elements is bonded onto a same side of the interposer as the networking die, wherein each of the plurality of functional elements is electrically coupled to one of the plurality of network interface units of the networking die through the plurality of metal connections.

In accordance with yet other embodiments, a package structure includes an interposer including a plurality of metal connections; and a networking unit built inside the interposer and including a plurality of switches/routers and a plurality of network interface units coupled to the plurality of switches/routers, wherein the plurality of network interface units are coupled to the plurality of metal connections, and wherein the interposer is substantially free from active devices that are not in the networking unit. A plurality of functional elements is bonded onto the interposer, wherein the plurality of functional elements is electrically coupled to the plurality of network interface units through the plurality of metal connections. A PCB is bonded on the interposer, wherein the PCB and the plurality of functional elements are on opposite sides of the interposer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
    an interposer comprising a plurality of metal connections;
    a networking unit built inside the interposer, the networking unit comprising:
        a plurality of switches/routers; and
        a plurality of network interface units coupled to the plurality of switches/routers, wherein the plurality of network interface units is electrically coupled to the plurality of metal connections; and
    a plurality of functional elements bonded onto the interposer, wherein the plurality of functional elements is electrically coupled to the plurality of network interface units through the plurality of metal connections, wherein one of the plurality of network interface units is not physically directly connected to one of the functional elements bonded on the interposer, and the one of the plurality of network interface units is connected to an unused port of the networking unit.

2. The package of claim 1, wherein the one of the plurality of network interface units is not directly connected to any of the functional elements bonded on the interposer.

3. The package of claim 1, wherein the interposer comprises through-substrate vias electrically interconnecting features on opposite sides of the interposer.

4. The package of claim 1, wherein the interposer comprises:
    conductive features on a first side of the interposer; and
    metal traces inside the interposer, wherein the metal traces electrically inter-couple the conductive features to a second side of the interposer, with the first side and the second side being opposite sides of the interposer.

5. The package of claim 1, wherein at least one of the plurality of functional elements comprises a processor.

6. The package of claim 1, wherein the interposer is substantially free from active devices that are in the interposer and outside the networking unit.

7. The package of claim 1, wherein the plurality of network interface units supports a plurality of different bus protocols, and is configured to convert data packages to messages that have different protocols.

8. A package comprising:
an interposer comprising:
a first surface;
a second surface opposite to the first surface; and
a networking unit comprising:
a plurality of switches/routers; and
a plurality of network interface units electrically coupled to the plurality of switches/routers;
a plurality of functional elements bonded onto the first surface of the interposer, wherein the plurality of functional elements is electrically coupled to the plurality of network interface units, wherein one of the plurality of network interface units is not physically directly connected to one of the functional elements bonded on the interposer, and the one of the plurality of network interface units is connected to an unused port of the networking unit; and
a printed circuit board (PCB) bonded to the second surface of the interposer.

9. The package of claim 8, wherein the interposer is substantially free from active devices built inside the interposer.

10. The package of claim 8, wherein at least one of the plurality of functional elements comprises a processor.

11. The package of claim 8, wherein the interposer is substantially free from active devices that are in the interposer and outside the networking unit.

12. The package of claim 8, wherein the plurality of network interface units supports a plurality of different bus protocols, and is configured to convert data packages to messages that have different protocols.

13. The package of claim 8, wherein the one of the plurality of network interface units is not directly connected to any of the functional elements bonded on the interposer.

14. The package of claim 8 further comprising a plurality of additional functional elements bonded directly to the PCB.

15. A package comprising:
an interposer comprising:
a first surface;
a second surface opposite to the first surface; and
a networking unit built inside the interposer, the networking unit comprising:
a plurality of switches/routers;
a plurality of network interface units electrically coupled to the plurality of switches/routers; and
a plurality of ports connected to bond pads of the interposer, wherein the bond pads are located on the first surface of the interposer;
a plurality of functional elements, each electrically connected to one of the plurality of ports, wherein one of the plurality of ports is not physically directly connected to one of the functional elements bonded on the interposer; and
a printed circuit board (PCB) bonded to the interposer, wherein the PCB is on an opposite side of the interposer than the plurality of functional elements.

16. The package of claim 15 further comprising a plurality of additional functional elements bonded directly to the PCB.

17. The package of claim 15, wherein the plurality of network interface units supports a plurality of different bus protocols.

18. The package of claim 15, wherein the one of the plurality of network interface units is connected to an unused port of the networking unit.

* * * * *